(12) United States Patent
Seshadri et al.

(10) Patent No.: US 8,184,474 B2
(45) Date of Patent: May 22, 2012

(54) ASYMMETRIC SRAM CELL WITH SPLIT TRANSISTORS ON THE STRONG SIDE

(75) Inventors: Anand Seshadri, Richardson, TX (US); Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 252 days.

(21) Appl. No.: 12/782,894

(22) Filed: May 19, 2010

(65) Prior Publication Data

US 2010/0296335 A1 Nov. 25, 2010

Related U.S. Application Data

(60) Provisional application No. 61/180,290, filed on May 21, 2009.

(51) Int. Cl.
*G11C 11/00* (2006.01)
(52) U.S. Cl. .......... 365/154; 365/156; 365/203
(58) Field of Classification Search .......... 365/156, 365/154, 203, 189.14, 189.11
See application file for complete search history.

(56) References Cited

U.S. PATENT DOCUMENTS 7,596,013 B2 * 9/2009 Yamaoka et al. ............. 365/154
* cited by examiner

*Primary Examiner* — David Lam
(74) *Attorney, Agent, or Firm* — Rose Alyssa Keagy; Wade J. Brady, III; Frederick J. Telecky, Jr.

(57) ABSTRACT

An integrated circuit containing an SRAM cell array in which each SRAM cell includes an auxiliary NMOS driver or PMOS load transistor plus a bit-side passgate transistor and a bit-bar-side passgate transistor. An integrated circuit containing an SRAM cell array in which each SRAM cell includes an auxiliary PMOS driver or NMOS load transistor plus a bit-side passgate transistor and a bit-bar-side passgate transistor. A process of operating an integrated circuit containing an SRAM cell array in which each SRAM cell includes an auxiliary NMOS driver or PMOS load transistor plus a bit-side passgate transistor and a bit-bar-side passgate transistor. A process of operating an integrated circuit containing an SRAM cell array in which each SRAM cell includes an auxiliary PMOS driver or NMOS load transistor plus a bit-side passgate transistor and a bit-bar-side passgate transistor.

20 Claims, 10 Drawing Sheets

ASYMMETRIC SRAM CELL WITH SPLIT TRANSISTORS ON THE STRONG SIDE

CROSS-REFERENCE TO RELATED APPLICATIONS

This application claims the benefit of priority under U.S.C. §119(e) of U.S. Provisional Application 61/180,290 (and entitled "An Asymmetric SRAM Cell With Split Transistors on the Strong Side"), filed May 21, 2009, the entirety of which is incorporated herein by reference.

Furthermore, this application is related to:

Patent application Ser. No. 12/782,908 (filed May 19, 2010) entitled "8T SRAM Cell With Four Load Transistors,"

patent application Ser. No. 12/782,874 (filed May 19, 2010) entitled "6T SRAM Cell With Single Sided Write,"

patent application Ser. No. 12/782,902 (filed May 19, 2010) entitled "8T SRAM Cell With Two Single-Sided Ports,"

patent application Ser. No. 12/782,941 (filed May 19, 2010) entitled "8T SRAM Cell With One Word Line," and patent application Ser. No. 12/782,927 (filed May 19, 2010) entitled "SRAM Cell for Single Sided Write."

With their mention in this section, these patent applications are not admitted to be prior art with respect to the present invention; patent application Ser. No. 12/782,894 (filed May 19, 2010).

FIELD OF THE INVENTION

This invention relates to the field of integrated circuits. More particularly, this invention relates to static random access memories (SRAMs) in integrated circuits.

DETAILED DESCRIPTION

Figure 1A:
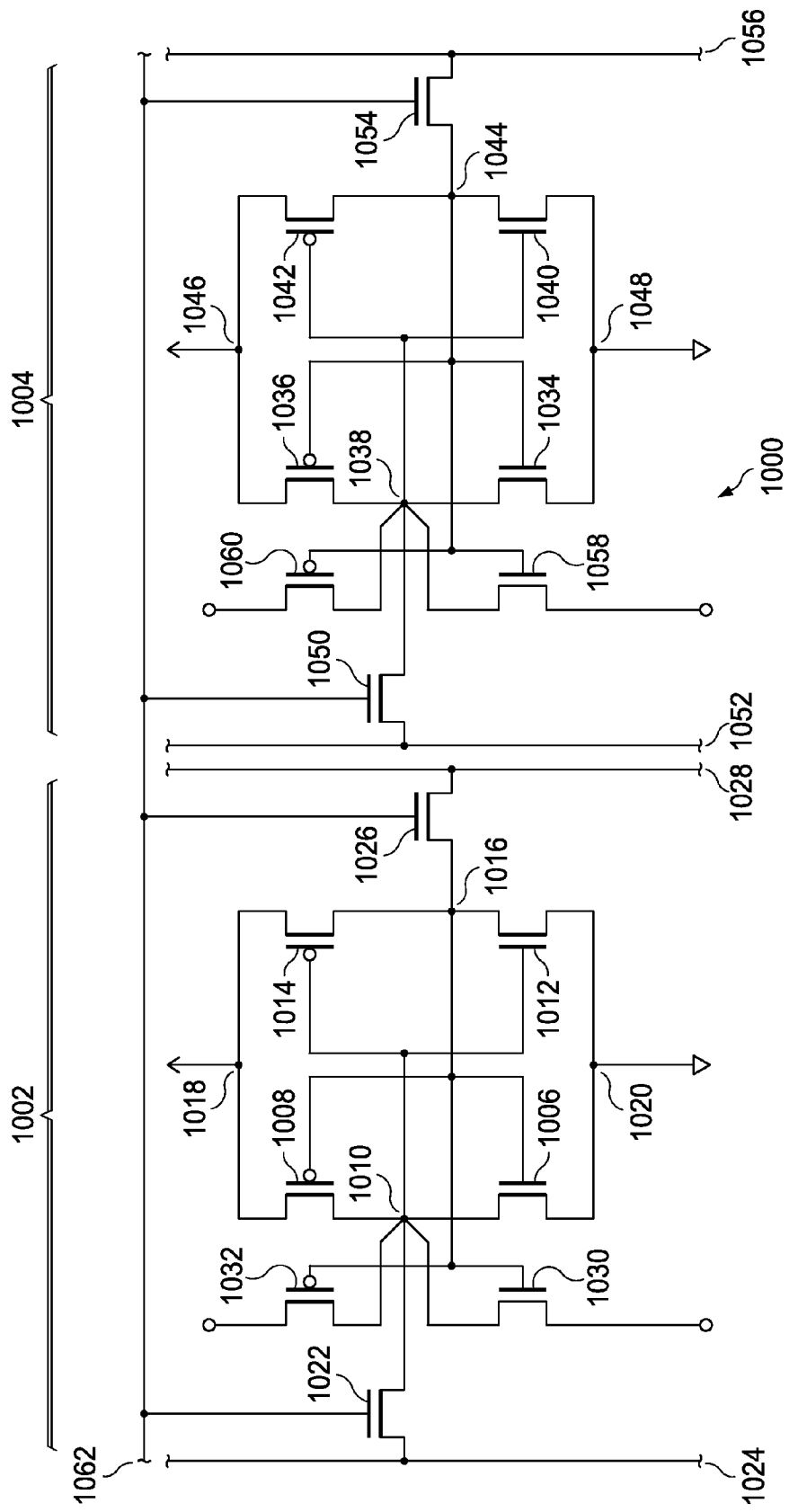
FIG. 1A through FIG. 1E are circuit diagrams of SRAM cells in an SRAM cell array contained in an integrated circuit.

Example embodiments are described with reference to the attached figures, wherein like reference numerals are used throughout the figures to designate similar or equivalent elements. The figures are not drawn to scale and they are provided merely to illustrate example embodiments. Various details, relationships, and methods are set forth to provide an understanding of the example embodiments. However, one skilled in the relevant art will readily recognize that the embodiments can be practiced without one or more of the specific details. In other instances, well-known structures or operations are not shown in detail to avoid obscuring the example embodiment. The example embodiments are not limited by the illustrated ordering of acts or events, as some acts may occur in different orders and/or concurrently with other acts or events. Furthermore, all illustrated acts or events may not be required to implement a methodology in accordance with an example embodiment.

For the purposes of this disclosure, the term "Vdd" is understood to refer to a power supply node with a potential suitable for source nodes of p-channel metal oxide semiconductor (PMOS) transistors. The term "high voltage" is understood to mean a potential substantially equal to Vdd. Similarly, the term "Vss" is understood to refer to a power supply node with a potential suitable for source nodes of n-channel metal oxide semiconductor (NMOS) transistors, and is lower than the Vdd potential. The term "low voltage" is understood to mean a potential substantially equal to Vss. The term "floated" is understood to mean disconnected from a voltage source such as Vdd or Vss, or connected to a voltage source through high impedance.

In this disclosure, the term "driver transistor" is understood to refer to a metal oxide semiconductor (MOS) transistor, possibly a finFET transistor, in an SRAM cell. A drain node of the driver transistor is connected to a data node of the SRAM cell. A gate node of the driver transistor is connected to an opposite data node of the SRAM cell from the driver drain node. A source node of the driver transistor is connected to a power supply node, typically either Vdd for PMOS driver transistors or Vss for NMOS driver transistors. A polarity of the driver transistor source node power supply is opposite a polarity of a read operation pre-charge potential of a corresponding data line which is connected to the driver transistor through a passgate transistor. Therefore, SRAM cells that pre-charge data lines to a high voltage have NMOS driver transistors, while SRAM cells that pre-charge data lines to a low voltage have PMOS driver transistors.

Similarly, the term "load transistor" is understood to refer to another MOS transistor, possibly a finFET transistor, in the SRAM cell. A drain node of the load transistor is connected to a data node of the SRAM cell. A gate node of the load transistor is connected to an opposite data node of the SRAM cell from the load drain node. A source node of the load transistor is connected to a power supply node, typically either Vdd for PMOS driver transistors or Vss for NMOS driver transistors. A polarity of the load transistor source node power supply is the same as the polarity of a read operation pre-charge potential of a corresponding data line which is connected to the driver transistor through a passgate transistor. Therefore, SRAM cells that pre-charge data lines to a high voltage have PMOS load transistors, while SRAM cells that pre-charge data lines to a low voltage have NMOS load transistors.

The term "passgate transistor" is understood to refer to yet another MOS transistor, possibly a finFET transistor, in the SRAM cell, of which one source/drain node is connected to a data node of the SRAM cell and an opposite source/drain node is connected to a corresponding data line of the SRAM cell.

For the purposes of this disclosure, the term "bit-side" is understood to refer to components such as a driver transistor, load transistor and passgate transistor connected a data node in an SRAM cell. Similarly, the term "bit-bar-side" is understood to refer to components connected to an opposite data node from the bit-side node in the SRAM cell. A bit-side data line is commonly referred to as a bit line. A bit-bar-side data line is commonly referred to as a bit-bar line.

For the purposes of this disclosure, the term "addressed SRAM cell" is understood to refer to an SRAM cell in which a passgate transistor and a second passgate transistor (if present) are turned on, while a bit line and a bit-bar line (if present) are connected to read circuitry or write circuitry. The term "half-addressed SRAM cell" is understood to refer to an SRAM cell in which a passgate transistor and a second passgate transistor (if present) is turned on, while a bit line and a bit-bar line (if present) are disconnected from read or write circuitry.

In some instances of integrated circuits containing SRAM cell arrays, substantially all circuits in the integrated circuit are dedicated to operation of the SRAM array. In these instances, circuits which provide data to be stored in the SRAM array and circuits which use data from the SRAM array are located outside the integrated circuit containing the SRAM array. In other instances of integrated circuits containing SRAM cell arrays (such as microprocessors, digital signal processors and wireless telephony controllers), the circuits which provide data to be stored in the SRAM array and circuits which use data from the SRAM array are located in the integrated circuit.

The instant invention provides an integrated circuit containing an SRAM cell array in which each SRAM cell includes an auxiliary driver transistor or auxiliary load transistor connected to one data node of the SRAM cell. Dimensions and fabrication processes of the auxiliary transistors may be adjusted to provide a higher on-state current in the auxiliary driver transistor or auxiliary load transistor than in the corresponding driver transistor or load transistor.

During write operations, source nodes of the auxiliary driver and load transistors in addressed SRAM cells may be floated or connected to power supply nodes to possibly improve data transfer from the bit data lines to the addressed SRAM cells. Source nodes of the auxiliary driver and load transistors in half-addressed SRAM cells may be connected to power supply nodes, to possibly reduce data inversion when the passgate transistors are turned on during the write operations.

During read operations, bit and bit-bar data lines of addressed cells are typically pre-charged to high voltage values or low voltage values, and are then optionally floated before being connected to the SRAM cell bit and bit-bar data nodes through passgate transistors. Also during read operations, the source nodes of the auxiliary driver and load transistors in addressed SRAM cells may be connected to power supply nodes to possibly improve static noise margin values in the addressed SRAM cells. In one embodiment, sense amplifiers (which detect polarities of data bits) may be connected only to bit lines connected to auxiliary transistors so as to possibly benefit from improved read currents provided by the auxiliary transistors. In one mode of operation, the source nodes of the auxiliary driver and load transistors in half-addressed SRAM cells are similarly connected to power supply nodes, to possibly reduce data inversion when the passgate transistors are turned on during the read operations.

In standby modes, it may be desirable to float the source nodes of the auxiliary driver and load transistors to possibly reduce leakage current in the SRAM cells.

FIG. 1A through FIG. 1D are circuit diagrams of SRAM cells in an SRAM cell array contained in an integrated circuit (1000). More specifically, FIG. 1A is a circuit diagram of the integrated circuit (1000) containing a first SRAM cell (1002) and a second SRAM cell (1004) as part of the SRAM cell array. The first SRAM cell (1002) includes an NMOS first bit-side driver transistor (1006) commonly known as a first bit driver (1006) and a PMOS first bit-side load transistor (1008) commonly known as a first bit load (1008). A drain node of the first bit driver (1006) and a drain node of the first bit load (1008) are connected to a first bit-side data node (1010). The first SRAM cell (1002) also includes an NMOS first bit-bar-side driver transistor (1012) commonly known as a first bit-bar driver (1012) and a PMOS first bit-bar-side load transistor (1014) commonly known as a first bit-bar load (1014). A drain node of the first bit-bar driver (1012) and a drain node of the first bit-bar load (1014) are connected to a first bit-bar-side data node (1016). A source node of the first bit load (1008) and a source node of the first bit-bar load (1014) are connected to a first Vdd node (1018). A source node of the first bit driver (1006) and a source node of the first bit-bar driver (1012) are connected to a first Vss node (1020). A gate node of the first bit driver (1006) and a gate node of the first bit load (1008) are connected to the first bit-bar-side data node (1016). Similarly, a gate node of the first bit-bar driver (1012) and a gate node of the first bit-bar load (1014) are connected to the first bit-side data node (1010).

The first SRAM cell (1002) also includes a first bit-side passgate transistor (1022) commonly known as a first bit passgate (1022). The first bit passgate (1022) may be an NMOS transistor as depicted in FIG. 1A, but may possibly be a PMOS transistor or other switching mechanism. A first source/drain node of the first bit passgate (1022) is connected to the first bit-side data node (1010) and a second source/drain node of the first bit passgate (1022) is connected to a first bit data line (1024). In one embodiment, an on-state current of the first bit passgate (1022) is between 100 percent and 200 percent an on-state current of the first bit driver (1006).

The first SRAM cell (1002) further includes a first bit-bar-side passgate transistor (1026) commonly known as a first bit-bar passgate (1026). The first bit-bar passgate (1026) may be a same polarity as the first bit passgate (1022). A first source/drain node of the first bit-bar passgate (1026) is connected to the first bit-bar-side data node (1016) and a second source/drain node of the first bit-bar passgate (1026) is connected to a first bit-bar data line (1028). In one embodiment, an on-state current of the first bit-bar passgate (1026) is between 100 percent and 200 percent an on-state current of the first bit-bar driver (1012).

The first SRAM cell (1002) includes at least one of an optional first auxiliary driver transistor (1030) and an optional first auxiliary load transistor (1032). A drain node of the first auxiliary driver transistor (1030), if present, is connected to the first bit-side data node (1010). A gate node of the first auxiliary driver transistor (1030) is connected to the first bit-bar-side data node (1016). A drain node of the first auxiliary load transistor (1032), if present, is connected to the first bit-side data node (1010). A gate node of the first auxiliary load transistor (1032) is connected to the first bit-bar-side data node (1016).

In one embodiment, an on-state current of the first auxiliary driver transistor (1030) is between 75 percent and 200 percent an on-state current of the first bit passgate (1022). In an alternate embodiment, the first auxiliary driver transistor (1030) may have a threshold voltage which is more than 50 millivolts lower than a threshold voltage of the first bit driver (1006). In a further embodiment, the on-state current of the first auxiliary driver transistor (1030) may be higher than an on-state current of the first bit driver (1006).

Similarly, in one embodiment, an on-state current of the first auxiliary load transistor (1032) is between 50 percent and 100 percent an on-state current of the first bit passgate (1022). In an alternate embodiment, the first auxiliary load transistor (1032) may have a threshold voltage which is more than 50 millivolts lower than a threshold voltage of the first bit load (1008). In a further embodiment, the on-state current of the first auxiliary load transistor (1032) may be higher than an on-state current of the first bit load (1008).

A layout of the second SRAM cell (1004) duplicates a layout of the first SRAM cell (1002). The second SRAM cell (1004) includes a second bit driver (1034) and a second bit load (1036); a drain node of the second bit driver (1034) and a drain node of the second bit load (1036) are connected to a second bit-side data node (1038). The second SRAM cell (1004) includes a second bit-bar driver (1040) and a second bit-bar load (1042); a drain node of the second bit-bar driver (1040) and a drain node of the second bit-bar load (1042) are connected to a second bit-bar-side data node (1044). A source node of the second bit load (1036) and a source node of the second bit-bar load (1042) are connected to a second Vdd node (1046). A source node of the second bit driver (1034) and a source node of the second bit-bar driver (1040) are connected to a second Vss node (1048). A gate node of the second bit driver (1034) and a gate node of the second bit load (1036) are connected to the second bit-bar-side data node (1044). A gate node of the second bit-bar driver (1040) and a gate node of the second bit-bar load (1042) are connected to the second bit-side data node (1038).

The second SRAM cell (1004) also includes a second bit passgate (1050). The second bit passgate (1050) is a same polarity as the first bit passgate (1022), which may be an NMOS transistor as depicted in FIG. 1A. A first source/drain node of the second bit passgate (1050) is connected to the second bit-side data node (1038) and a second source/drain node of the second bit passgate (1050) is connected to a second bit data line (1052). The second SRAM cell (1004) also includes a second bit-bar passgate (1054). The second bit-bar passgate (1054) is a same polarity as the first bit-bar passgate (1026), which may be an NMOS transistor as depicted in FIG. 1A. A first source/drain node of the second bit-bar passgate (1054) is connected to the second bit-bar-side data node (1044) and a second source/drain node of the second bit-bar passgate (1054) is connected to a second bit-bar data line (1056).

The second SRAM cell (1004) includes a second auxiliary driver transistor (1058) if the optional first auxiliary driver transistor (1030) is present, and it includes a second auxiliary load transistor (1060) if the optional first auxiliary load transistor (1032) is present. A drain node of the second auxiliary driver transistor (1058), if present, is connected to the second bit-side data node (1038). A gate node of the second auxiliary driver transistor (1058) is connected to the second bit-bar-side data node (1044). A drain node of the second auxiliary load transistor (1060), if present, is connected to the second bit-side data node (1038). A gate node of the second auxiliary load transistor (1060) is connected to the second bit-bar-side data node (1044). Thresholds and on-state currents of the second auxiliary driver transistor (1058) and second auxiliary load transistor (1060) are substantially equal to thresholds and on-state currents of the first auxiliary driver transistor (1030) and the first auxiliary load transistor (1032), respectively (as discussed supra).

A gate node of the first bit passgate (1022), a gate node of the first bit-bar passgate (1026), a gate node of the second bit passgate (1050) and a gate node of the second bit-bar passgate (1054) are connected to a word line (1062). It is common for the first bit data line (1024) and the first bit-bar data line (1028) to be connected to passgates in other SRAM cells (not shown) in a same column as the first SRAM cell (1002). Similarly, it is common for the second bit data line (1052) and the second bit-bar data line (1056) to be connected to passgates in other SRAM cells (not shown) in a same column as the second SRAM cell (1004). Furthermore, it is common for the word line (1062) to be connected to passgates in other SRAM cells (not shown) in a same row as the first SRAM cell (1002) and the second SRAM cell (1004).

In one embodiment, the driver transistors (1006, 1012, 1034, 1040) and the load transistors (1008, 1014, 1036, 1042) are a minimum size consistent with fabrication methods used to manufacture the integrated circuit (1000). Minimizing driver and load transistor sizes may reduce a size of the integrated circuit (1000) and may reduce manufacturing costs per SRAM array.

In an alternate embodiment, the driver transistors (1006, 1012, 1034, 1040), the load transistors (1008, 1014, 1036, 1042) and the auxiliary transistors (1030, 1032, 1058, 1060) may be finFET transistors. Forming the SRAM array in the integrated circuit (1000) with finFET transistors may reduce a size of the integrated circuit (1000) and may reduce manufacturing costs per integrated circuit.

Figure 1B:
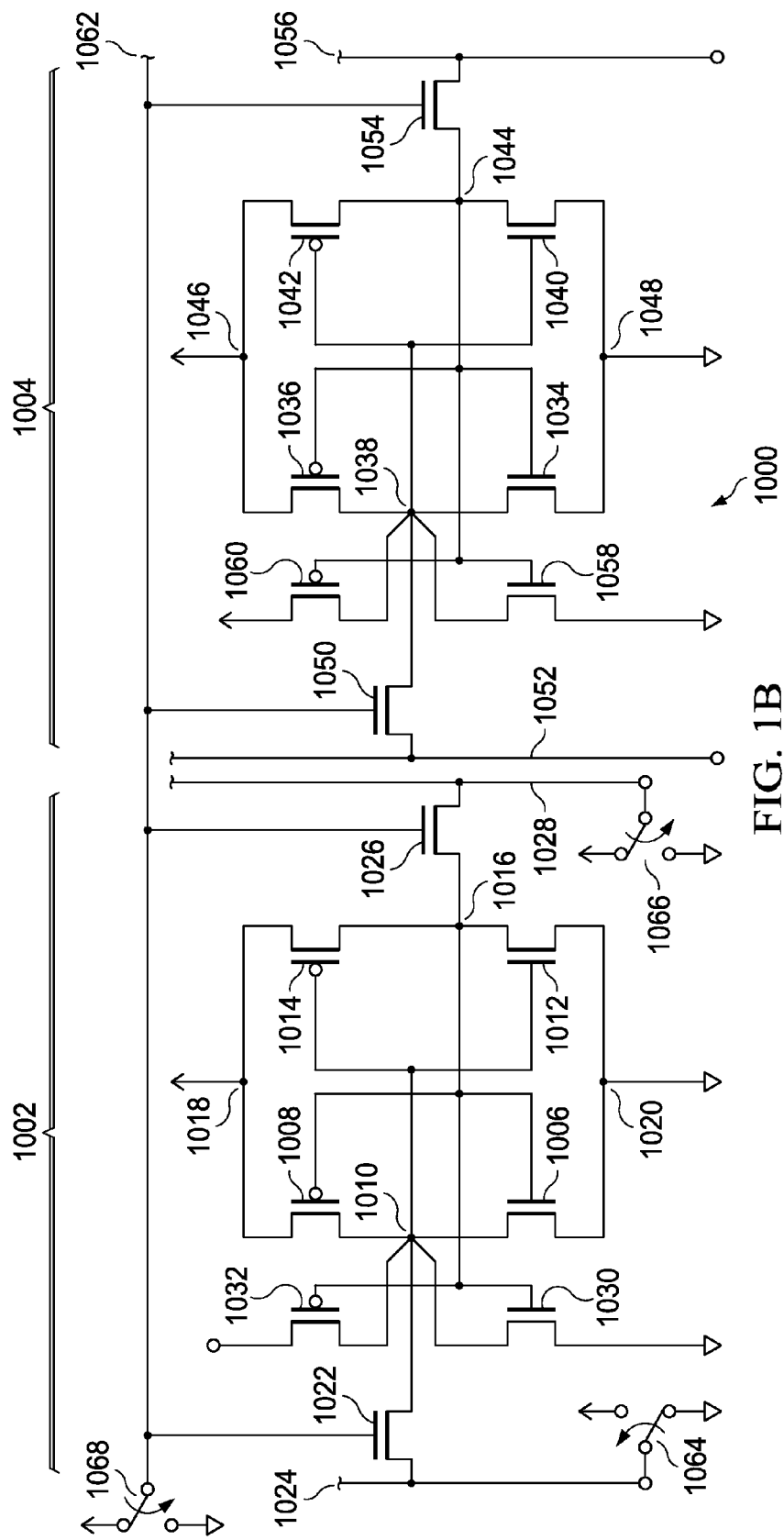

FIG. 1B depicts the integrated circuit (1000) during a write low operation to write a first data bit to the first SRAM cell (1002) which results in a low voltage on the first bit-side data node (1010). The first SRAM cell (1002) is addressed for writing, and the second SRAM cell (1004) is half-addressed. The second bit data line (1052) and the second bit-bar data line (1056) are pre-charged to a high voltage and then optionally floated. A source node of the second auxiliary driver transistor (1058), if present, is connected to Vss. A source node of the second auxiliary load transistor (1060), if present, is connected to Vdd. A source node of the first auxiliary driver transistor (1030), if present, may be connected to Vss (as shown), or it may be floated. A source node of the first auxiliary load transistor (1032), if present, may be connected to Vss or it may be floated (as shown). The first bit data line (1024) is connected to a low voltage source such as Vss as depicted by bit data line switch (1064). The first bit-bar data line (1028) is connected to a high voltage source such as Vdd as depicted by bit-bar data line switch (1066). The word line (1062) is connected to a voltage source, depicted schematically in FIG. 1B by word line switch (1068), whereby the first bit passgate (1022), the first bit-bar passgate (1026), the second bit passgate (1050) and the second bit-bar passgate (1054) are turned on. In a successful write operation, the potential substantially equal to Vss on the first bit data line (1024) is transferred to the first bit-side data node (1010) and becomes stabilized.

Connecting source nodes of auxiliary driver transistors or auxiliary load transistors to Vss in addressed SRAM cells (1002) during a write low operation may reduce write failures by providing additional conductance paths between the bit-side data nodes in the addressed SRAM cells and Vss nodes. Floating source nodes of auxiliary driver transistors or auxiliary load transistors during a write low operation may reduce write failures by improving a transfer function of the potential on the bit data lines to the bit-side data nodes. Write failures are write operations in which the potentials on the bit data lines are not successfully transferred to bit-side data nodes and stabilized.

Connecting source nodes of auxiliary driver transistors in half-addressed SRAM cells (1004) to Vss and connecting source nodes of auxiliary load transistors to Vdd during a write low operation reduce data upsets in the half addressed SRAM cells (1004) by providing lower resistance paths from the bit-side data nodes to Vss and Vdd in the half addressed SRAM cells. Data upsets are events in which the data bits stored in SRAM cells become inverted (for example a "1" value is changed to a "0" value and vice versa).

Figure 1C:
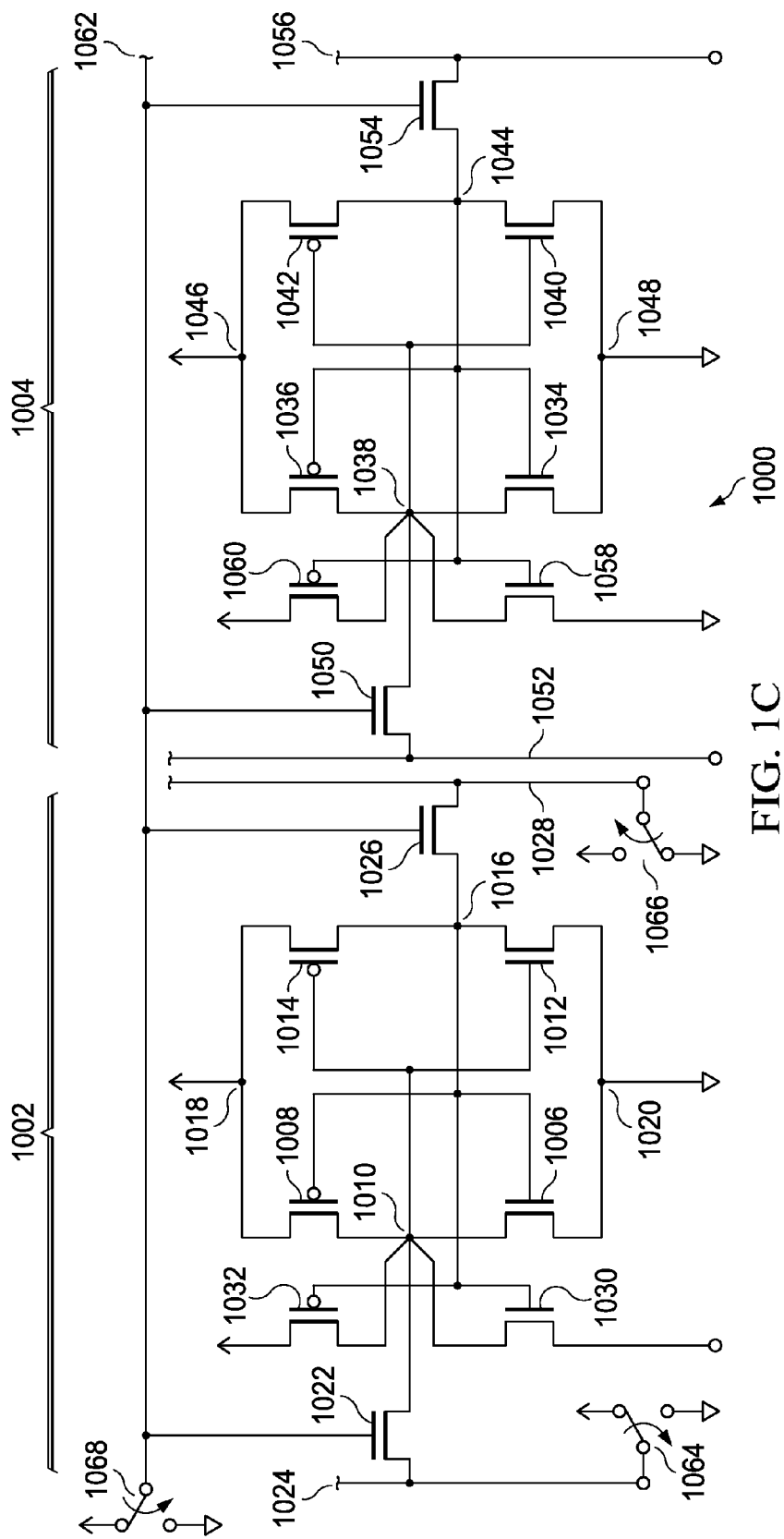
Figure 1D:
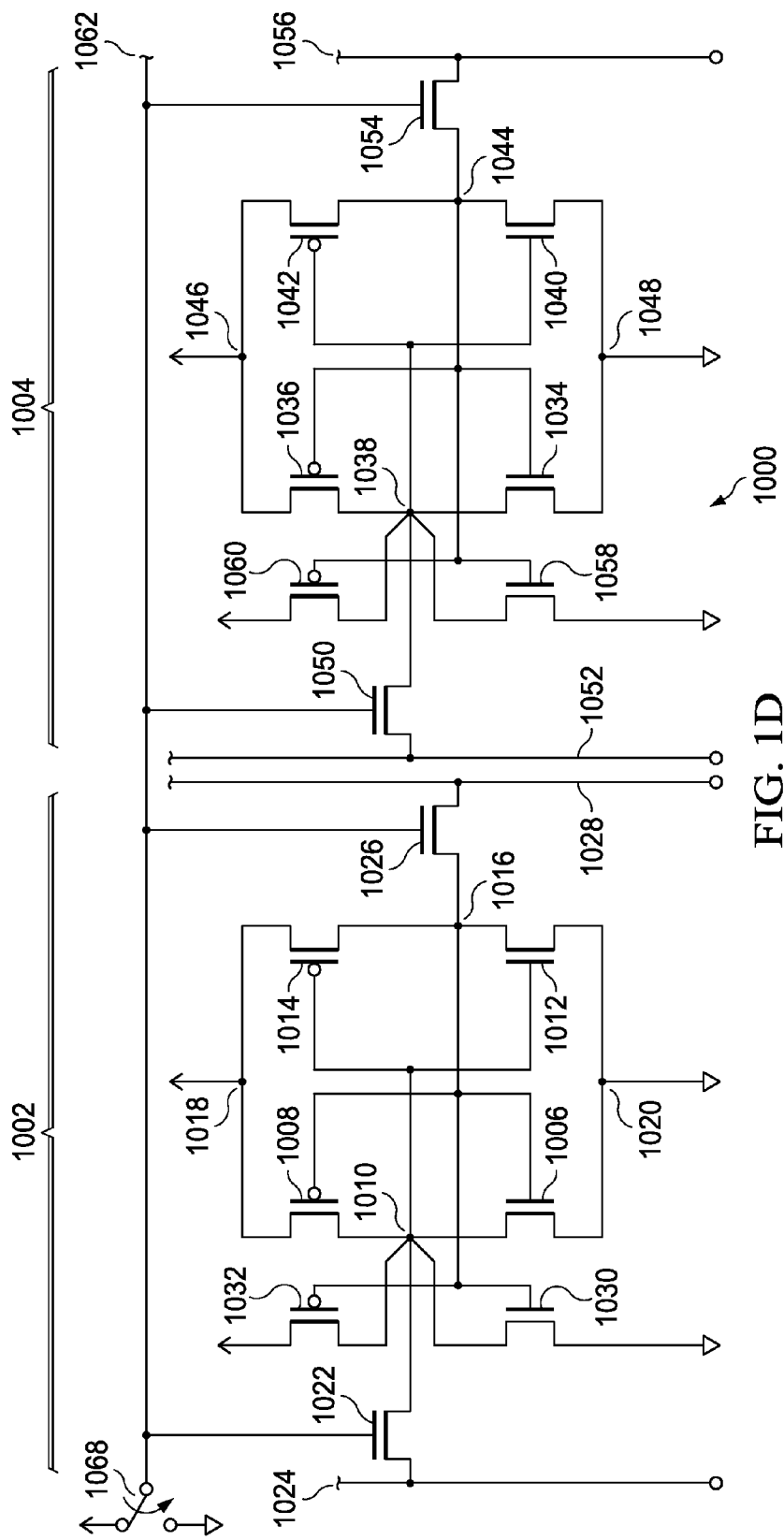
Figure 1E:
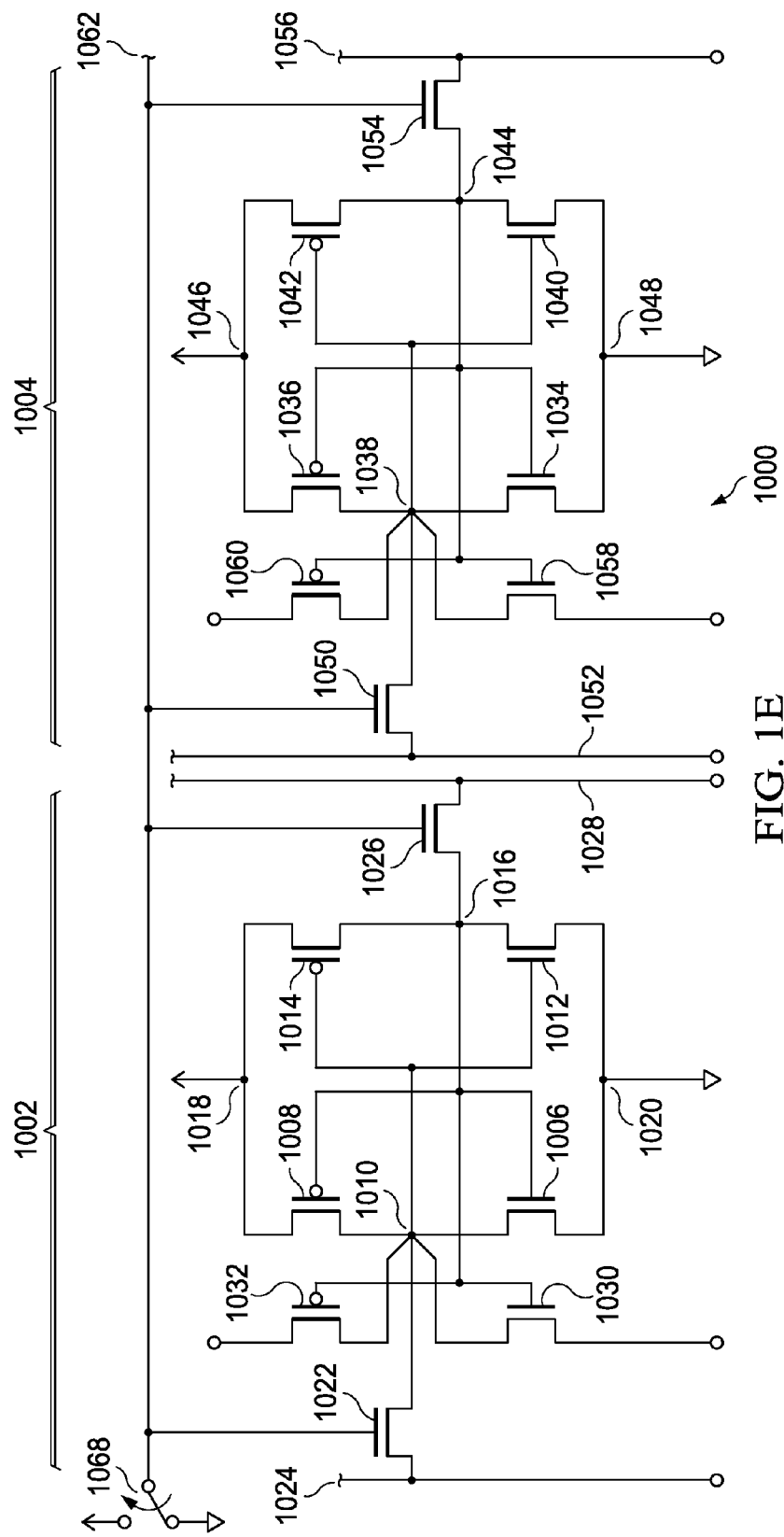
Figure 2A:
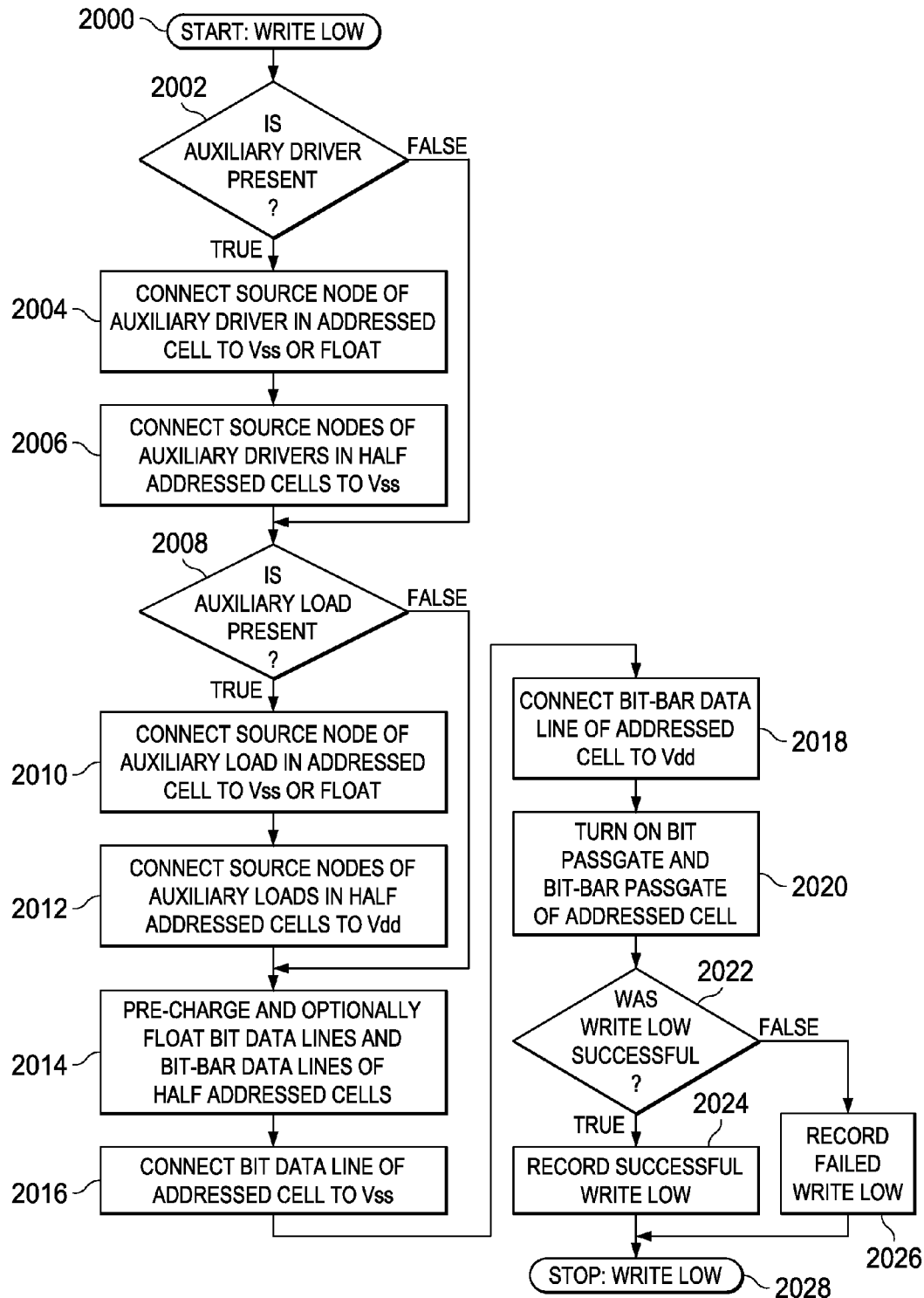
FIG. 2A through FIG. 2D are flowcharts of a write low operation, a write high operation, a read operation, and a transition to standby mode, respectively.

FIG. 2A through FIG. 2D are flowcharts of a write low operation, a write high operation, a read operation, and a transition to standby mode, respectively. The flowcharts in FIG. 2A through FIG. 2D refer to an SRAM array as depicted in FIG. 1A through FIG. 1E. Referring to FIG. 2A, the write low operation begins (2000) with step (2002) which is to determine if an auxiliary driver transistor is present. If the auxiliary driver transistor is present, step (2004) is executed, which is to connect a source node of the auxiliary driver in an addressed SRAM cell to Vss. In an alternate embodiment of the write low operation, the source node of the auxiliary driver in the addressed SRAM cell may be floated. Following execution of step (2004), step (2006) is executed, which is to connect source nodes of auxiliary drivers in half addressed cells to Vss. Following execution of step (2006), or if the auxiliary driver transistor is not present, step (2008) is executed, which is to determine if an auxiliary load transistor is present. If the auxiliary load transistor is present, step (2010) is executed, which is to float a source node of the auxiliary driver in the addressed SRAM cell. In an alternate embodiment of the write low operation, the source node of the auxiliary driver in the addressed SRAM cell may be floated. Following execution of step (2010), step (2012) is executed, which is to connect source nodes of auxiliary loads in half addressed cells to Vdd. Following execution of step (2012), or if the auxiliary load transistor is not present, step (2014) is executed, which is to pre-charge and optionally float bit data lines and bit-bar data lines of half addressed SRAM cells. Following execution of step (2014), step (2016) is executed, which is to connect a bit data line of the addressed SRAM cell to Vss. Following execution of step (2016), step (2018) is executed, which is to connect a bit-bar data line of the addressed SRAM cell to Vdd. Following execution of step (2018), step (2020) is executed, which is to turn on a bit passgate and a bit-bar passgate of the addressed SRAM cell by connecting the word line to a voltage source. In embodiments of the write low operation which are part of test operations, following execution of step (2020), step (2022) is executed, which is to determine if a low voltage was successfully transferred to a bit-side data node and a data value in the half-addressed SRAM cell was not upset. If the low voltage was successfully transferred to the bit-side data node and the data value in the half-addressed SRAM cell was not upset, step (2024) is executed, which is to record a successful write low operation for the addressed SRAM cell. If the low voltage was not successfully transferred to the bit-side data node or the data value in the half-addressed SRAM cell was upset, step (2026) is executed, which is to record a failed write low operation for the addressed SRAM cell. After step (2024) or step (2026) is executed, or after step (2020) is executed in embodiments which are not part of test operations, the write low operation is ended (2022). In other embodiments of the write low operation, steps (2002), (2008), (2014), (2016) and (2018) may be performed in any order.

FIG. 1C depicts the integrated circuit (1000) during a write high operation to write a second data bit to the first SRAM cell (1002) which results in a high voltage on the first bit-side data node (1010). The first SRAM cell (1002) is addressed for writing, and the second SRAM cell (1004) is half-addressed. The second bit data line (1052) and the second bit-bar data line (1056) are pre-charged to a high voltage and then optionally floated. A source node of the second auxiliary driver transistor (1058), if present, is connected to Vss. A source node of the second auxiliary load transistor (1060), if present, is connected to Vdd.

A source node of the first auxiliary driver transistor (1030), if present, may be connected to Vdd, or may be floated (as shown). A source node of the first auxiliary load transistor (1032), if present, may be connected to Vdd (as shown), or may be floated. The first bit data line (1024) is connected to a high voltage source such as Vdd as depicted by bit data line switch (1064). The first bit-bar data line (1028) is connected to a low voltage source such as Vss as depicted by bit-bar data line switch (1066). The word line (1062) is connected to a voltage source, depicted schematically in FIG. 1C by word line switch (1068), whereby the first bit passgate (1022), the first bit-bar passgate (1026), the second bit passgate (1050) and the second bit-bar passgate (1054) are turned on. In a successful write operation, the potential substantially equal to Vdd on the first bit data line (1024) is transferred to the first bit-side data node (1010) and becomes stabilized.

Connecting the source nodes of auxiliary driver transistors or auxiliary load transistors to Vdd in addressed SRAM cells during a write high operation may reduce write failures by providing additional conductance paths between the bit-side data nodes in the addressed SRAM cells and Vdd nodes. Floating the source nodes of auxiliary driver transistors or auxiliary load transistors during a write high operation may reduce write failures by improving a transfer function of the potential on the bit data lines to the bit-side data nodes.

Connecting the source nodes of auxiliary driver transistors in half-addressed SRAM cells to Vss and connecting the source nodes of auxiliary load transistors to Vdd during a write high operation may reduce data upsets in the half addressed SRAM cells by providing lower resistance paths from the bit-side data nodes to Vss and Vdd in the half addressed SRAM cells.

Figure 2B:
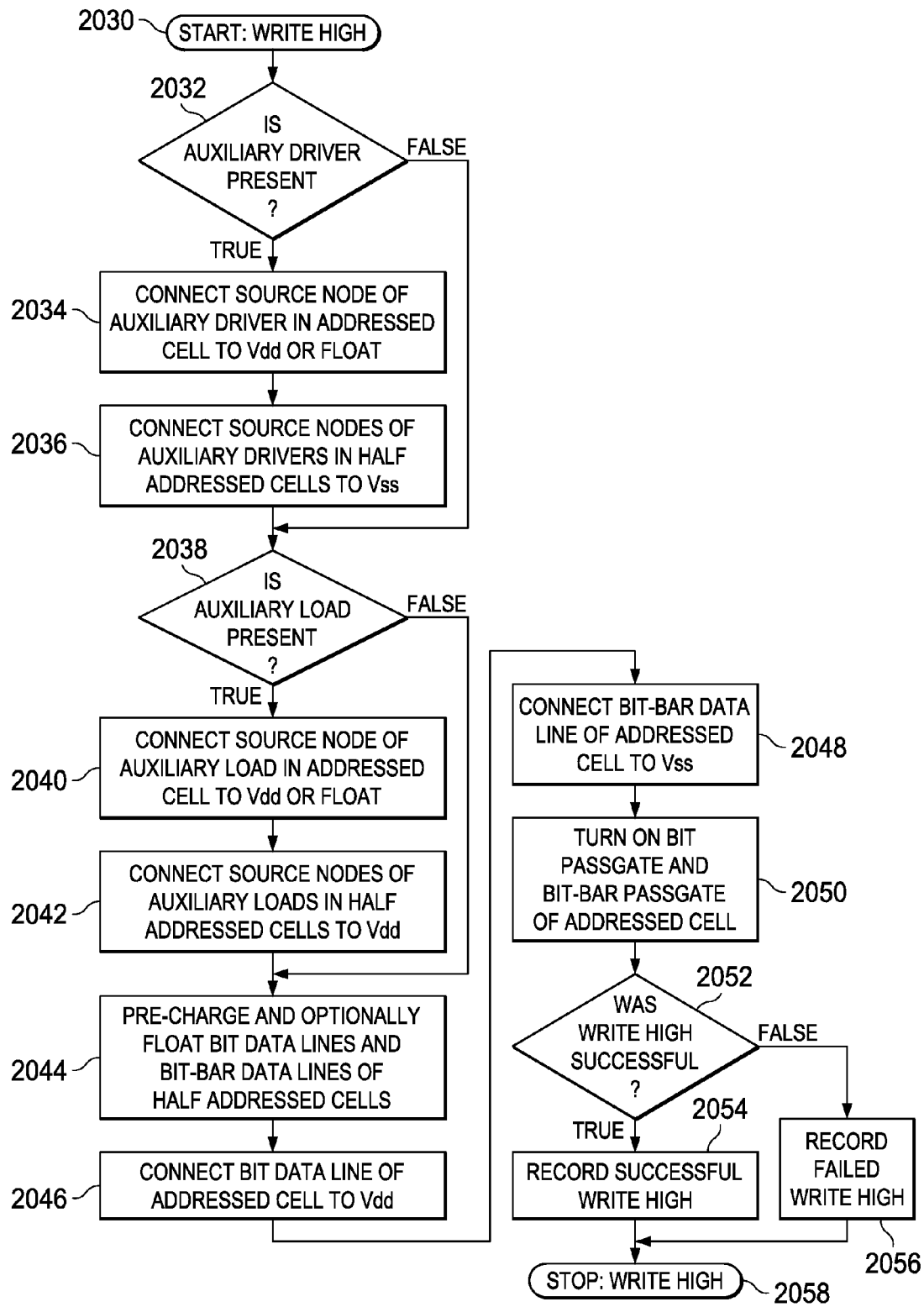

Referring to FIG. 2B, the write high operation begins (2030) with step (2032) which is to determine if the auxiliary driver transistor is present. If the auxiliary driver transistor is present, step (2034) is executed, which is to float the source node of the auxiliary driver in the addressed SRAM cell. In an alternate embodiment of the write high operation, the source node of the auxiliary driver in the addressed SRAM cell may be connected to Vdd. Following execution of step (2034), step (2036) is executed, which is to connect source nodes of auxiliary drivers in half addressed cells to Vss. Following execution of step (2036), or if the auxiliary driver transistor is not present, step (2038) is executed, which is to determine if the auxiliary load transistor is present. If the auxiliary load transistor is present, step (2040) is executed, which is to connect the source node of the auxiliary load in the addressed SRAM cell to Vdd. In an alternate embodiment of the write high operation, the source node of the auxiliary load in the addressed SRAM cell may be floated. Following execution of step (2040), step (2042) is executed, which is to connect source nodes of auxiliary loads in half addressed cells to Vdd. Following execution of step (2042), or if the auxiliary load transistor is not present, step (2044) is executed, which is to pre-charge and optionally float bit data lines and bit-bar data lines of half addressed SRAM cells. Following execution of step (2044), step (2046) is executed, which is to connect the bit data line of the addressed SRAM cell to Vdd. Following execution of step (2046), step (2048) is executed, which is to connect the bit-bar data line of the addressed SRAM cell to Vss. Following execution of step (2048), step (2050) is executed, which is to turn on the bit passgate and the bit-bar passgate of the addressed SRAM cell. In embodiments of the write high operation which are part of test operations, following execution of step (2050), step (2052) is executed, which is to determine if a high voltage was successfully transferred to the bit-side data node and a data value in the half-addressed SRAM cell was not upset. If the high voltage was successfully transferred to the bit-side data node and the data value in the half-addressed SRAM cell was not upset, step (2054) is executed, which is to record a successful write high operation for the addressed SRAM cell. If the low voltage was not successfully transferred to the bit-side data node or the data value in the half-addressed SRAM cell was upset, step (2056) is executed, which is to record a failed write high operation for the addressed SRAM cell. After step (2054) or step (2056) is executed, or after step (2050) is executed in embodiments which are not part of test operations, the write high operation is ended (2058). In other embodiments of the write high operation, steps (2032), (2040), (2044), (2046) and (2048) may be performed in any order.

FIG. 1D depicts the integrated circuit (1000) during a read operation to read a data bit from the first SRAM cell (1002). In the read operation depicted in FIG. 1D, the first SRAM cell (1002) is addressed for reading, and the second SRAM cell (1004) is half-addressed. The second bit data line (1052) and second bit-bar data line (1056) are pre-charged to a high voltage and then optionally floated. The source node of the second auxiliary driver transistor (1058), if present, is connected to Vss. The source node of the second auxiliary load transistor (1060), if present, is connected to Vdd. The source node of the first auxiliary driver transistor (1030), if present, is connected to Vss. The source node of the first auxiliary load transistor (1032), if present, is connected to Vdd.

The first bit data line (1024) and the first bit-bar data bit line (1028) are connected to a high voltage source such as Vdd to pre-charge the first bit data line (1024) and the first bit-bar data bit line (1028), and are then optionally floated (as shown). The word line (1062) is connected to a voltage source, depicted schematically in FIG. 1D by word line switch (1068), whereby the first bit passgate (1022), the first bit-bar passgate (1026), the second bit passgate (1050) and the second bit-bar passgate (1054) are turned on. In one embodiment, a sense amplifier (which detects a polarity of a data bit) may be connected only to the first data bit line (1024). The first data bit line (1024) is connected to the auxiliary transistors (1030, 1032) through the first bit passgate (1022), so as to possibly benefit from an increased read current provided by the auxiliary transistors (1030, 1032). In a successful read operation, a potential on the first bit-side data node (1010) is transferred to the first bit data line (1024) and a corresponding opposite potential on the first bit-bar-side data node (1016) is transferred to the first bit-bar data line (1028). This may in turn trigger circuitry that is located outside the SRAM cell array (not shown) and connected to the first bit data line (1024) and possibly the first bit-bar data line (1028).

Connecting source nodes of auxiliary driver transistors in addressed SRAM cells to Vss during a read operation may provide lower resistance paths between the bit-side data nodes and Vss which may reduce read failures. Similarly, connecting source nodes of auxiliary load transistors in addressed SRAM cells to Vdd during a read operation may provide lower resistance paths between the bit-side data nodes and Vdd which may reduce read failures. (A read failure is a read operation in which a potential on a bit-side data node and a corresponding opposite potential on a bit-bar side data node are not successfully transferred to a bit data line and a bit-bar data line, respectively, such that a correct value of a data bit from an addressed SRAM cell is not detected by external circuitry.)

Moreover, connecting source nodes of auxiliary driver transistors in half-addressed SRAM cells to Vss and connecting source nodes of auxiliary load transistors in half-addressed SRAM cells to Vdd during a read operation may reduce data upsets in the half addressed SRAM cells by possibly providing lower resistance paths from the bit-side data nodes to Vss and Vdd in the half addressed SRAM cells.

Figure 2C:
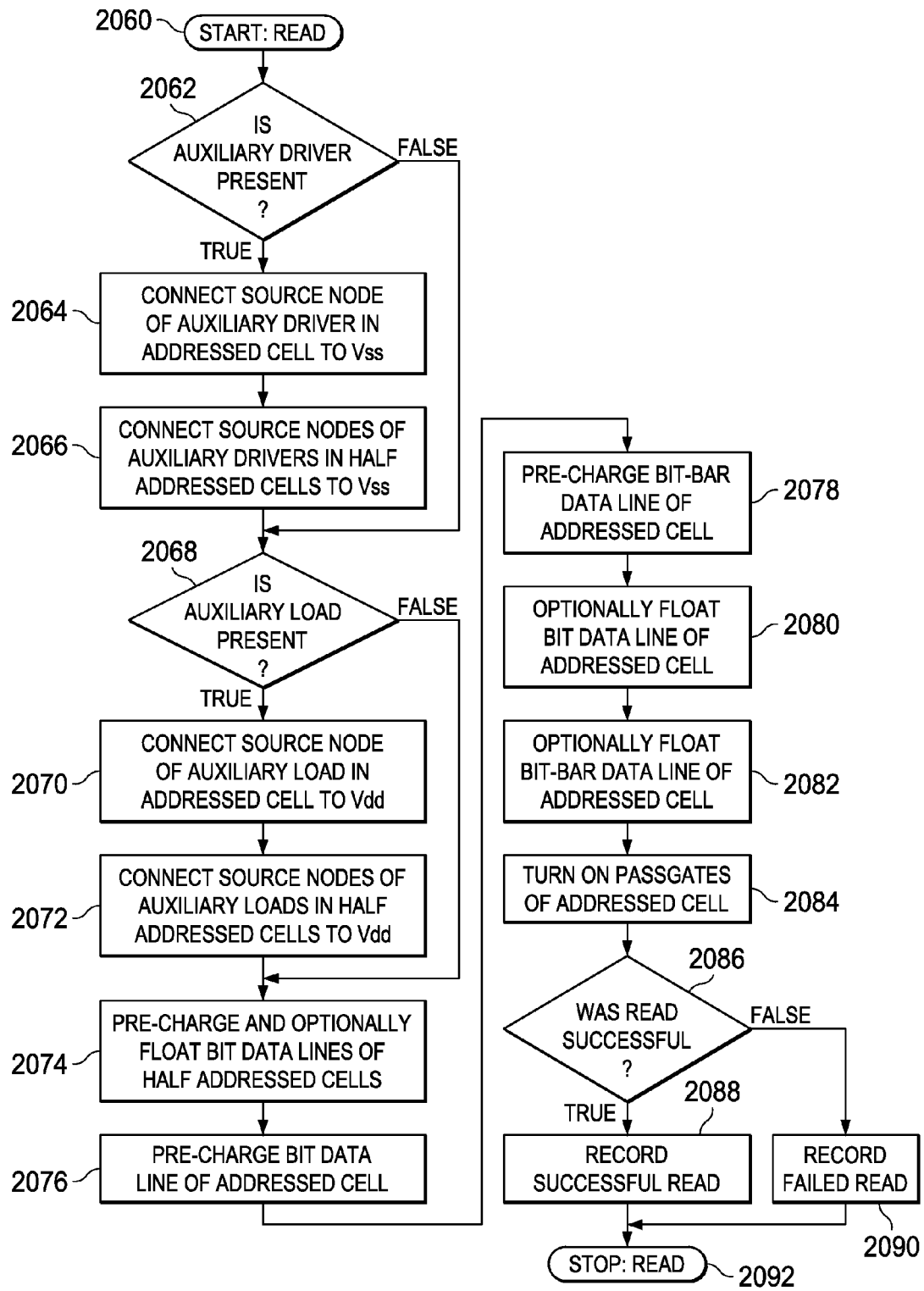

Referring to FIG. 2C, the read operation begins (2060) with step (2062) which is to determine if the auxiliary driver transistor is present. If the auxiliary driver transistor is present, step (2064) is executed, which is to connect the source node of the auxiliary driver in the addressed SRAM cell to Vss. Following execution of step (2064), step (2066) is executed, which is to connect source nodes of auxiliary drivers in half addressed cells to Vss. Following execution of step (2066), or if the auxiliary driver transistor is not present, step (2068) is executed, which is to determine if the auxiliary load transistor is present. If the auxiliary load transistor is present, step (2070) is executed, which is to connect the source node of the auxiliary driver in the addressed SRAM cell to Vdd. Following execution of step (2070), step (2072) is executed, which is to connect source nodes of auxiliary loads in half addressed cells to Vdd. Following execution of step (2072), or if the auxiliary load transistor is not present, step (2074) is executed, which is to pre-charge and optionally float bit data lines and bit-bar data lines of half addressed SRAM cells. Following execution of step (2074), step (2076) is executed, which is to pre-charge the bit data line of the addressed SRAM cell to a potential appropriate for read circuitry used in the SRAM. For example, the bit data line of the addressed SRAM cell may be pre-charged to Vdd. Following execution of step (2076), step (2078) is executed, which is to pre-charge the bit-bar data line of the addressed cell to substantially the same potential as the bit data line of the addressed SRAM cell. Following execution of step (2078), step (2080) is executed, which is to optionally float the bit data line of the addressed SRAM cell. Following execution of step (2080), step (2082) is executed, which is to optionally float the bit-bar data line of the addressed SRAM cell. Following execution of step (2082), step (2084) is executed, which is to turn on a bit passgate and a bit-bar passgate of the addressed SRAM cell. In embodiments of the read operation which are part of test operations, following execution of step (2084), step (2086) is executed, which is to determine if a potential on the bit-side data node was successfully transferred to the bit data line and a data value in the half-addressed SRAM cell was not upset. If the potential on the bit-side data node was successfully transferred to the bit data line and the data value in the half-addressed SRAM cell was not upset, step (2088) is executed, which is to record a successful read operation for the addressed SRAM cell. If the potential on the bit-side data node was not successfully transferred to the bit data line or the data value in the half-addressed SRAM cell was upset, step (2090) is executed, which is to record a failed read operation for the addressed SRAM cell. After step (2088) or step (2090) is executed, or after step (2084) is executed in embodiments which are not part of test operations, the read operation is ended (2092).

In other embodiments of the read operation, steps (2062), (2068) and (2074) may be performed in any order. In yet further embodiments of the read operation, steps (2076) and (2078) may be performed in any order. In still further embodiments of the read operation, steps (2080) and (2082) may be performed in any order.

FIG. 1E depicts the integrated circuit (1000) in a standby mode, that is, a condition in which read operations and write operations are not performed and which is furthermore configured to reduce power consumption in the integrated circuit (1000). The word line (1062) is connected to a voltage source, depicted schematically in FIG. 1E by word line switch (1068), whereby the first bit passgate (1022), the first bit-bar passgate (1026), the second bit passgate (1050) and the second bit-bar passgate (1054) are turned off The source nodes of the first auxiliary driver transistor (1030), the first auxiliary load transistor (1032), the second auxiliary driver transistor (1058) and the second auxiliary load transistor (1060) are floated. The first bit data line (1024), the first bit-bar data line (1028), the second bit data line (1052) and the second bit-bar data line (1056) are optionally floated. Floating source nodes of auxiliary driver transistors and auxiliary load transistors during standby mode may reduce the leakage current through the auxiliary driver transistors and auxiliary load transistors.

Figure 2D:
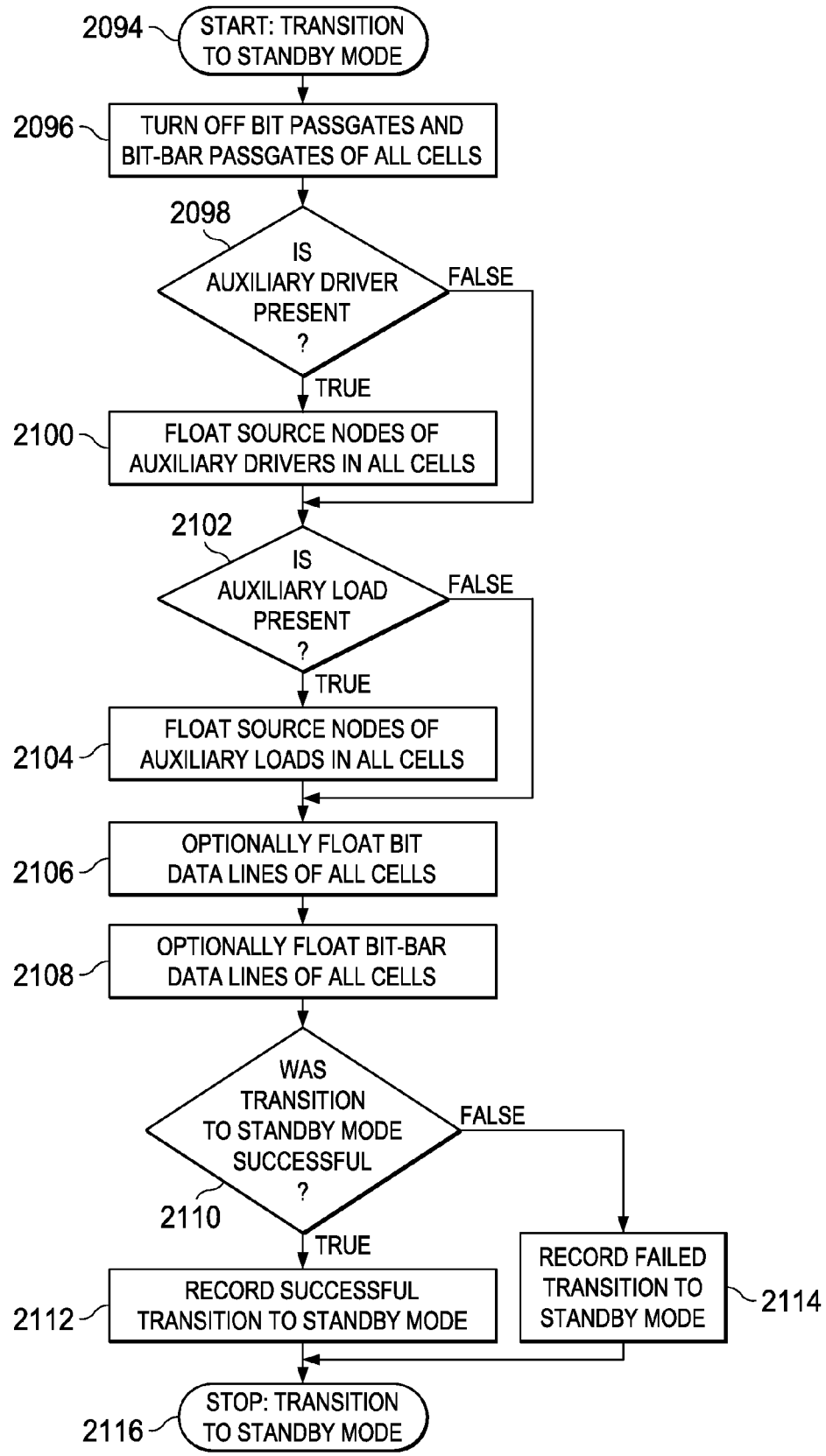

Referring to FIG. 2D, the transition to standby mode operation begins (2094) with step (2096) which is to turn off bit passgates and bit-bar passgates of all SRAM cells. Following execution of step (2096), step (2098) is executed, which is to determine if the auxiliary driver transistor is present. If the auxiliary driver transistor is present, step (2100) is executed, which is to float the source nodes of auxiliary driver transistors in all SRAM cells. Following execution of step (2100), or if the auxiliary driver transistor is not present, step (2102) is executed, which is to determine if the auxiliary load transistor is present. If the auxiliary load transistor is present, step (2104) is executed, which is to float the source nodes of auxiliary load transistors in all SRAM cells. Following execution of step (2104), or if the auxiliary load transistor is not present, step (2106) is executed, which is to optionally float bit data lines of all SRAM cells. Following execution of step (2106), step (2108) is executed, which is to optionally float bit-bar data lines of all SRAM cells. In embodiments of the transition to standby mode operation which are part of test operations (such as measurements of leakage currents in SRAM cell arrays), following execution of step (2108), step (2110) is executed, which is to determine if the transition to standby mode was successful (for example, if leakage currents were below target values). If the transition to standby mode was successful, step (2112) is executed, which is to record a successful transition to standby mode operation for the addressed SRAM cell. If the transition to standby mode was not successful, step (2114) is executed, which is to record a failed transition to standby mode operation for the addressed SRAM cell. After step (2112) or step (2114) is executed, or after step (2108) is executed in embodiments which are not part of test operations, the transition to standby mode operation is ended (2116). In other embodiments of the transition to standby mode operation, steps (2098), (2102), (2106) and (2108) may be performed in any order.

It will be recognized by those familiar with SRAM cell design and operation that the auxiliary driver or auxiliary load transistors (of an opposite polarity than the auxiliary driver and auxiliary load transistors discussed supra) may also be used in SRAM cells which have PMOS drivers and NMOS loads.

Figure 3:
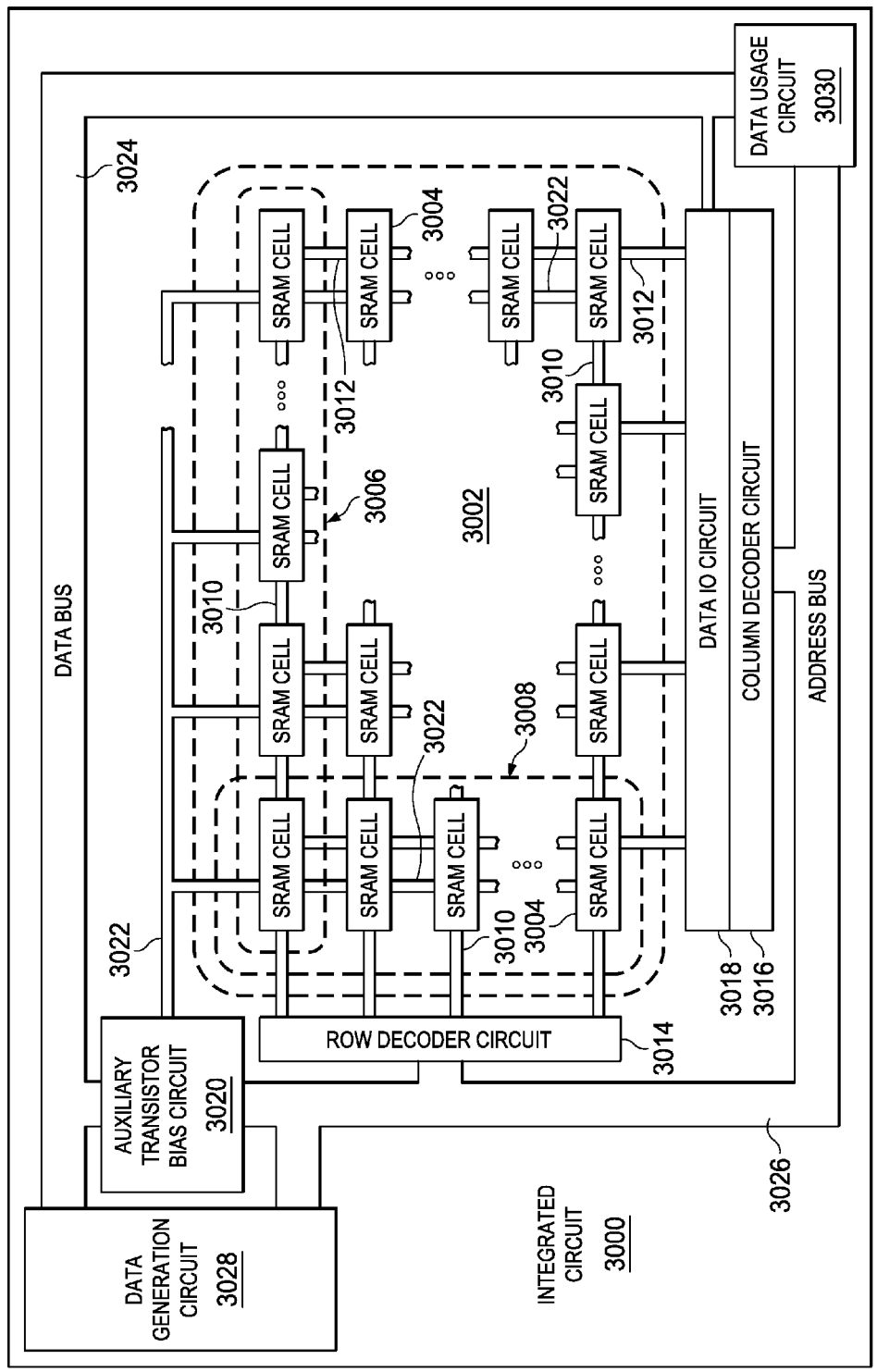
FIG. 3 depicts an integrated circuit containing an SRAM cell array which includes SRAM cells formed according to an embodiment.

FIG. 3 depicts an integrated circuit (3000) containing an SRAM cell array (3002) which includes SRAM cells (3004) formed according to an embodiment of the instant invention. The SRAM cells (3004) are arranged in rows (3006) and columns (3008). Each word line (3010) is connected to SRAM cells (3004) in a row (3006). Each bit line bus (3012) is connected to SRAM cells (3004) in a column (3008). Each bit line bus (3012) may include one or more bit or bit-bar lines. A row decoder circuit (3014) applies appropriate biases to word lines (3010). A column decoder circuit (3016) applies appropriate biases to bit or bit-bar lines in the bit line buses (3012). A data input/output (IO) circuit (3018) reads data from the bit or bit-bar lines in the bit line buses (3012) during read operations and applies appropriate potentials to the bit or bit-bar lines in the bit line buses (3012) during write operations. An auxiliary transistor bias circuit (3020) applies biases to an auxiliary transistor bias bus (3022) which is connected to auxiliary transistors in the SRAM cells (3004). The auxiliary transistor bias circuit (3020) is capable of biasing the auxiliary transistors independently by column. The integrated circuit further includes a data bus (3024) which carries data bits between the SRAM cell array (3002) and other circuits in the integrated circuit (3000), and an address bus (3026) which is used to select SRAM cells (3004) in the SRAM cell array (3002) for read and write operations. The address bus (3026) is connected to the row decoder circuit (3014), the column decoder circuit (3016) and the auxiliary transistor bias circuit (3020). The integrated circuit (3000) may also contain a data generation circuit (3028) which connects to the data bus (3024) and address bus (3026). The data generation circuit (3028) produces incoming data bits for storage in the SRAM cell array (3002). The data bus (3024) carries the incoming data bits from the data generation circuit (3028) to the SRAM cell array (3002). The integrated circuit (3000) may also contain a data usage circuit (3030) which connects to the data bus (3024) and address bus (3026). The data usage circuit (3030) uses outgoing data bits which were stored in the SRAM cell array (3002). The data bus (3024) carries the outgoing data bits from the SRAM cell array (3002) to the data usage circuit (3030).

While various example embodiments have been described above, it should be understood that they have been presented by way of example only and not limitation. Numerous changes to the disclosed embodiments can be made in accordance with the disclosure herein without departing from the spirit or scope of the example embodiments. Thus, the breadth and scope of the example embodiments should not be limited. Rather, the scope of the example embodiments should be defined in accordance with the following claims and their equivalents.

What is claimed is:

1. An integrated circuit, comprising:
an array of SRAM cells, each said SRAM cell comprising:
   a Vdd node;
   a PMOS bit-side load transistor; said bit-side load transistor further including a gate node, a source node and a drain node, wherein said source node of said bit-side load transistor is connected to said Vdd node;
   a bit-side data node, wherein said bit-side data node is connected to said drain node of said bit-side load transistor;
   an NMOS bit-side driver transistor, said bit-side driver transistor further including a gate node, a source node and a drain node, wherein said drain node of said bit-side driver transistor is connected to said bit-side data node;
   a Vss node, wherein said Vss node is connected to said source node of said bit-side driver transistor;
   a PMOS bit-bar-side load transistor; said bit-bar-side load transistor further including a gate node, a source node and a drain node, wherein said source node of said bit-bar-side load transistor is connected to said Vdd node and said gate node of said bit-bar-side load transistor is connected to said bit-side data node;
   a bit-bar-side data node, wherein said bit-bar-side data node is connected to said drain node of said bit-bar-side load transistor, to said gate node of said bit-side load transistor and to said gate node of said bit-side driver transistor;
   an NMOS bit-bar-side driver transistor, said bit-bar-side driver transistor further including a gate node, a source node and a drain node, wherein said drain node of said bit-bar-side driver transistor is connected to said bit-bar-side data node, said source node of said bit-bar-side driver transistor is connected to said Vss node, and said gate node of said bit-bar-side driver transistor is connected to said bit-side data node;
   a bit-side passgate transistor, said bit-side passgate transistor further including a gate node, a first source/drain node and a second source/drain node, wherein said gate node of said bit-side passgate transistor is connected to a word line, said first source/drain node of said bit-side passgate transistor is connected to said bit-side data node and said second source/drain node of said bit-side passgate transistor is connected to a bit data line;

a bit-bar-side passgate transistor, said bit-bar-side passgate transistor further including a gate node, a first source/drain node and a second source/drain node, wherein said gate node of said bit-bar-side passgate transistor is connected to said word line, said first source/drain node of said bit-bar-side passgate transistor is connected to said bit-bar-side data node and said second source/drain node of said bit-bar-side passgate transistor is connected to a bit-bar data line; and an auxiliary transistor, said auxiliary transistor further including a gate node, a source node and a drain node, wherein said gate node of said auxiliary transistor is connected to said bit-bar-side data node, and said drain node of said auxiliary transistor is connected to said bit-side data node.

2. The integrated circuit of claim 1, in which said auxiliary transistor is an NMOS auxiliary driver transistor.

3. The integrated circuit of claim 1, in which said auxiliary transistor is a PMOS auxiliary load transistor.

4. The integrated circuit of claim 3, further including an NMOS auxiliary driver transistor, said auxiliary driver transistor further including a gate node, a source node and a drain node, wherein said gate node of said auxiliary driver transistor is connected to said bit-bar-side data node, and said drain node of said auxiliary driver transistor is connected to said bit-side data node.

5. The integrated circuit of claim 1, further including:
a data bus coupled to said SRAM cell array;
an address bus coupled to said SRAM cell array;
a data generation circuit coupled to said data bus and said address bus;
a data usage circuit coupled to said data bus and said address bus; and
an auxiliary transistor bias control circuit coupled to said SRAM cell array, said auxiliary transistor bias control circuit being configured to provide a first set of bias potentials to said source nodes of said auxiliary transistor in addressed SRAM cells and to provide a second set of bias potentials to said source nodes of said auxiliary transistor in half-addressed SRAM cells.

6. An integrated circuit, comprising:
an array of SRAM cells, each said SRAM cell comprising:
a Vdd node;
a first NMOS bit-side driver transistor; said bit-side driver transistor further including a gate node, a source node and a drain node, wherein said source node of said bit-side driver transistor is connected to said Vdd node;
a bit-side data node, wherein said bit-side data node is connected to said drain node of said bit-side driver transistor;
an PMOS bit-side load transistor, said bit-side load transistor further including a gate node, a source node and a drain node, wherein said drain node of said bit-side load transistor is connected to said bit-side data node;
a Vss node, wherein said Vss node is connected to said source node of said bit-side load transistor;
a NMOS bit-bar-side driver transistor; said bit-bar-side driver transistor further including a gate node, a source node and a drain node, wherein said source node of said bit-bar-side driver transistor is connected to said Vdd node and said gate node of said bit-bar-side driver transistor is connected to said bit-side data node;

a bit-bar-side data node, wherein said bit-bar-side data node is connected to said drain node of said bit-bar-side driver transistor, to said gate node of said bit-side driver transistor and to said gate node of said bit-side load transistor;

an PMOS bit-bar-side load transistor, said bit-bar-side load transistor further including a gate node, a source node and a drain node, wherein said drain node of said bit-bar-side load transistor is connected to said bit-bar-side data node, said source node of said bit-bar-side load transistor is connected to said Vss node, and said gate node of said bit-bar-side load transistor is connected to said bit-side data node;

a bit-side passgate transistor, said bit-side passgate transistor further including a gate node, a first source/drain node and a second source/drain node, wherein said gate node of said bit-side passgate transistor is connected to a word line, said first source/drain node of said bit-side passgate transistor is connected to said bit-side data node and said second source/drain node of said bit-side passgate transistor is connected to a bit data line;

a bit-bar-side passgate transistor, said bit-bar-side passgate transistor further including a gate node, a first source/drain node and a second source/drain node, wherein said gate node of said bit-bar-side passgate transistor is connected to said word line, said first source/drain node of said bit-bar-side passgate transistor is connected to said bit-bar-side data node and said second source/drain node of said bit-bar-side passgate transistor is connected to a bit-bar data line; and an auxiliary transistor, said auxiliary transistor further including a gate node, a source node and a drain node, wherein said gate node of said auxiliary transistor is connected to said bit-bar-side data node, and said drain node of said auxiliary transistor is connected to said bit-side data node.

7. The integrated circuit of claim 6, in which said auxiliary transistor is a PMOS auxiliary driver transistor.

8. The integrated circuit of claim 6, in which said auxiliary transistor is an NMOS auxiliary load transistor.

9. The integrated circuit of claim 8, further including a PMOS auxiliary driver transistor, said auxiliary driver transistor further including a gate node, a source node and a drain node, wherein said gate node of said auxiliary driver transistor is connected to said bit-bar-side data node, and said drain node of said auxiliary driver transistor is connected to said bit-side data node.

10. The integrated circuit of claim 6, further including:
a data bus coupled to said SRAM cell array;
an address bus coupled to said SRAM cell array;
a data generation circuit coupled to said data bus and said address bus;
a data usage circuit coupled to said data bus and said address bus; and
an auxiliary transistor bias control circuit coupled to said SRAM cell array, said auxiliary transistor bias control circuit being configured to provide a first set of bias potentials to said source nodes of said auxiliary transistor in addressed SRAM cells and to provide a second set of bias potentials to said source nodes of said auxiliary transistor in half-addressed SRAM cells.

11. A process of operating an integrated circuit containing an array of SRAM cells, comprising:
- writing a first data bit to an addressed SRAM cell of said array of SRAM cells by a process comprising:
  - connecting a source node of an auxiliary transistor in said addressed SRAM cell to a Vss node;
  - connecting a bit data line of said addressed SRAM cell to said Vss node;
  - connecting a bit-bar data line of said addressed SRAM cell to a Vdd node; and
  - subsequently turning on a bit-side passgate transistor of said addressed SRAM cell and a bit-bar-side passgate transistor of said addressed SRAM cell;
- writing a second data bit to said addressed SRAM cell by a process comprising:
  - connecting said source node of said auxiliary transistor in said addressed SRAM cell to said Vdd node;
  - connecting said bit data line of said addressed SRAM cell to said Vdd node;
  - connecting said bit-bar data line of said addressed SRAM cell to said Vss node; and
  - subsequently turning on said bit-side passgate transistor and said bit-bar-side passgate transistor; and
- reading a data value from said addressed SRAM cell, by a process comprising:
  - biasing said source node of said auxiliary transistor of said addressed SRAM cell;
  - pre-charging said bit data line of said addressed SRAM cell to a potential substantially equal to Vdd;
  - pre-charging said bit-bar data line of said addressed SRAM cell to a potential substantially equal to Vdd; and
  - subsequently turning on said bit-side passgate transistor and said bit-bar-side passgate transistor of said addressed SRAM cell.

12. The process of claim 11, further including the process of transitioning said addressed SRAM cell to a standby mode, comprising:
- turning off said bit-side passgate transistor and said bit-bar-side passgate transistor of said addressed SRAM cell; and
- subsequently floating said source node of said auxiliary transistor of said addressed SRAM cell.

13. The process of claim 11, in which said auxiliary transistor is an NMOS auxiliary driver transistor.

14. The process of claim 11, in which said auxiliary transistor is a PMOS auxiliary load transistor.

15. The process of claim 14, in which said step of writing a first data bit includes connecting a source node of an NMOS auxiliary driver transistor in said addressed SRAM cell to said Vss node, said step of writing a second data bit includes connecting said source node of said auxiliary driver transistor in said addressed SRAM cell to said Vdd node; and said step of reading a data value includes connecting said source node of said auxiliary driver transistor to said Vss node.

16. A process of operating an integrated circuit containing an array of SRAM cells, comprising:
- writing a first data bit to an addressed SRAM cell of said array of SRAM cells by a process comprising:
  - connecting a source node of an auxiliary transistor in said addressed SRAM cell to a Vdd node;
  - connecting a bit data line of said addressed SRAM cell to said Vdd node;
  - connecting a bit-bar data line of said addressed SRAM cell to a Vss node; and
  - subsequently turning on a bit-side passgate transistor of said addressed SRAM cell and a bit-bar-side passgate transistor of said addressed SRAM cell;
- writing a second data bit to said addressed SRAM cell by a process comprising:
  - connecting said source node of said auxiliary transistor in said addressed SRAM cell to said Vss node;
  - connecting said bit data line of said addressed SRAM cell to said Vss node;
  - connecting said bit-bar data line of said addressed SRAM cell to said Vdd node; and
  - subsequently turning on said bit-side passgate transistor and said bit-bar-side passgate transistor;
- reading a data value from said addressed SRAM cell, by a process comprising:
  - biasing said source node of said auxiliary transistor of said addressed SRAM cell;
  - connecting said bit data line of said addressed SRAM cell to a potential substantially equal to Vss;
  - connecting said bit-bar data line of said addressed SRAM cell to a potential substantially equal to Vss; and
  - subsequently turning on said bit-side passgate transistor and said bit-bar-side passgate transistor of said addressed SRAM cell.

17. The process of claim 16, further including the step of transitioning said addressed SRAM cell to a standby mode, comprising:
- turning off said bit-side passgate transistor and said bit-bar-side passgate transistor of said addressed SRAM cell; and
- subsequently floating said source node of said auxiliary transistor of said addressed SRAM cell.

18. The process of claim 16, in which said auxiliary transistor is a PMOS auxiliary driver transistor.

19. The process of claim 16, in which said auxiliary transistor is an NMOS auxiliary load transistor.

20. The process of claim 19, in which said step of writing a first data bit includes connecting said source node of a PMOS auxiliary driver transistor in said addressed SRAM cell to said Vdd node, said step of writing a second data bit includes connecting said source node of said auxiliary driver transistor in said addressed SRAM cell to said Vss node; and said step of reading a data value includes connecting said source node of said auxiliary driver transistor to said Vdd node.

* * * * *